(12) United States Patent
Marumo et al.

(10) Patent No.: US 11,313,907 B2
(45) Date of Patent: Apr. 26, 2022

(54) ARC DISCHARGE DETECTION DEVICE

(71) Applicant: OMRON Corporation, Kyoto (JP)

(72) Inventors: Katsuya Marumo, Otsu (JP); Yasushi Kawashima, Kusatsu (JP); Hajime Umeki, Kyoto (JP); Junji Obata, Osaka (JP); Keisuke Yano, Kusatsu (JP)

(73) Assignee: OMRON Corporation, Kyoto (JP)

( * ) Notice: Subject to any disclaimer, the term of this patent is extended or adjusted under 35 U.S.C. 154(b) by 317 days.

(21) Appl. No.: 16/639,734

(22) PCT Filed: Jan. 22, 2019

(86) PCT No.: PCT/JP2019/001741
§ 371 (c)(1),
(2) Date: Feb. 17, 2020

(87) PCT Pub. No.: WO2019/163364
PCT Pub. Date: Aug. 29, 2019

(65) Prior Publication Data
US 2020/0185903 A1 Jun. 11, 2020

(30) Foreign Application Priority Data
Feb. 23, 2018 (JP) .............................. JP2018-030298

(51) Int. Cl.
*H02H 1/00* (2006.01)
*G06F 1/26* (2006.01)
(Continued)

(52) U.S. Cl.
CPC ........... *G01R 31/327* (2013.01); *G01R 19/17* (2013.01); *G01R 31/52* (2020.01); *G01R 31/56* (2020.01);
(Continued)

(58) Field of Classification Search
CPC ........ G01R 31/00; G01R 31/12; G01R 31/14; G01R 31/327; G01R 31/50; G01R 31/52;
(Continued)

(56) References Cited

U.S. PATENT DOCUMENTS 5,546,266 A * 8/1996 Mackenzie .............. H02H 3/04
361/115
5,933,305 A * 8/1999 Schmalz .............. H02H 1/0015
361/115
(Continued)

FOREIGN PATENT DOCUMENTS

CN 101238623 8/2008
CN 101677181 3/2010
(Continued)

OTHER PUBLICATIONS

"International Search Report (Form PCT/ISA/210) of PCT/JP2019/001741," dated Apr. 9, 2019, with English translation thereof, pp. 1-4.
(Continued)

*Primary Examiner* — Hoai-An D. Nguyen
(74) *Attorney, Agent, or Firm* — JCIPRNET (57) ABSTRACT

A control panel includes power supply circuits for supplying power supply voltages to loads and a connection part for connecting wiring. The control panel comprises a system current detection unit that is for detecting a sudden increase in system current that is from a power system and flows through the control panel and includes a second current transformer, and individual current detection units that are for detecting a sudden increase in the individual current of one of the power supply circuits and include first current transformers. An arc discharge detection unit identifies an arc discharge occurring within the control panel separately from a surge flowing into the system based on a system
(Continued)

current detection signal and individual current detection signals.

12 Claims, 6 Drawing Sheets

(51) Int. Cl.
    *G01R 19/17*     (2006.01)
    *G01R 31/327*     (2006.01)
    *G01R 31/52*     (2020.01)
    *G01R 31/56*     (2020.01)
    *H02B 3/00*     (2006.01)

(52) U.S. Cl.
    CPC ............ *G06F 1/26* (2013.01); *H02H 1/0015* (2013.01); *H02B 3/00* (2013.01)

(58) Field of Classification Search
    CPC .... G01R 31/56; G01R 19/00; G01R 19/0084; G01R 19/0092; G01R 19/165; G01R 19/17; G01R 19/25; G01R 19/2513; G06F 1/00; G06F 1/26; H02B 3/00; H02H 1/00; H02H 1/0007; H02H 1/0015
    USPC .............................. 324/76.11, 500, 512, 536
    See application file for complete search history.

(56) References Cited

U.S. PATENT DOCUMENTS

| | | | |
|---|---|---|---|
| 2005/0103613 A1 | 5/2005 | Miller | |
| 2012/0229939 A1* | 9/2012 | Mikani | ............. G01R 31/1227 361/55 |
| 2016/0234923 A1* | 8/2016 | Tabata | .................... H05H 1/24 |

FOREIGN PATENT DOCUMENTS

| | | |
|---|---|---|
| CN | 101752108 | 6/2010 |
| CN | 202864726 | 4/2013 |
| CN | 103415972 | 11/2013 |
| CN | 105954624 | 9/2016 |
| CN | 107465179 | 12/2017 |
| CN | 109417285 | 3/2019 |
| JP | 2000028675 | 1/2000 |
| JP | 2010135323 | 6/2010 |
| JP | 2013132157 | 7/2013 |
| JP | 2014167704 | 9/2014 |
| JP | 2016217747 | 12/2016 |
| JP | 6234647 | 11/2017 |
| TW | M288461 | 3/2006 |
| TW | M496762 | 3/2015 |
| TW | 201517696 | 5/2015 |
| TW | M575987 | 4/2019 |

OTHER PUBLICATIONS

"Written Opinion of the International Searching Authority (Form PCT/ISA/237) of PCT/JP2019/001741," dated Apr. 9, 2019, with English translation thereof, pp. 1-8.

"Office Action of Taiwan Counterpart Application", dated Oct. 4, 2019, with English translation thereof, p. 1-p. 12.

"Office Action of China Counterpart Application" with English translation thereof, dated Aug. 2, 2021, p. 1-p. 23.

* cited by examiner

ARC DISCHARGE DETECTION DEVICE

CROSS-REFERENCE TO RELATED APPLICATION

This application is a 371 application of the International PCT application serial no. PCT/JP2019/001741, filed on Jan. 22, 2019, which claims the priority benefit of Japan Patent Application No. 2018-030298, filed on Feb. 23, 2018. The entirety of each of the above-mentioned patent applications is hereby incorporated by reference herein and made a part of this specification.

TECHNICAL FIELD

The present invention relates to an arc discharge detection device that detects an arc discharge occurring in a control panel connected between a power system and a load.

BACKGROUND ART

In devices handling electric power, for example, a power source, and the like, there is concern that, if a connection part, a terminal, or the like of wiring gets loose, an arc discharge will occur at the part, which may lead to a major accident such as fire, or the like.

For this reason, in order to prevent an accident caused by an arc discharge from occurring in factories in which a comparatively large amount of electric power is handled, countermeasures have been taken by detecting the occurrence of an arc discharge.

Examples of method of directly detecting an arc discharge include a method of detecting specific light generated when an arc discharge occurs and a method of detecting a significant change in a current flowing in wiring when an arc discharge occurs.

Patent Literature 1 (Japanese Patent Application Laid-Open No. 2014-167704), for example, discloses a wireless communication system in which a measured value of an electric current flowing in wiring inside a distribution board is wirelessly transmitted to a device disposed outside the distribution board.

SUMMARY OF INVENTION

In the above-described method of detecting light generated when an arc discharge occurs, targets to be monitored are limited since a light detector needs to be provided at a place in which it is likely to receive light. In such a system disclosed in Patent Literature 1, although a sudden change in a current value to be monitored can be detected using the method of detecting a change in a current flowing through wiring, there is concern of a change in a current caused by a surge attributable to a power system being falsely detected as an arc discharge, even though it is not caused by an arc discharge.

Therefore, the present invention is to provide an arc discharge detection device that can prevent a sudden change in a current caused by a surge from being falsely detected as an arc discharge and detect the occurrence of an arc discharge in a control panel.

An arc discharge detection device as an example of the present disclosure is a device that detects an arc discharge occurring in a control panel connected between a power system and a load. The control panel has a power supply circuit supplying a power supply voltage to the load and a connection part for connecting wiring. In addition, an arc discharge detection device as an example of the present disclosure includes a system current detection unit detecting an increase in a system current that flows from the power system into the control panel and exceeds a system current threshold, an individual current detection unit detecting an increase in an individual current that flows in the power supply circuit and exceeds an individual current threshold, and an arc discharge detection unit identifying the arc discharge occurring in the control panel separately from a surge flowing into the power system based on a detection signal of the system current from the system current detection unit and a detection signal of the individual current from the individual current detection unit.

With this configuration, the arc discharge detection unit can identify an arc discharge occurring in the control panel based on the detection signal of the system current and the detection signal of the individual current, separately from a surge flowing into the power system, and thus it is possible to prevent a sudden change in the current caused by the surge from being falsely detected as an arc discharge.

In addition, the arc discharge detection device as an example of the present disclosure is a device that detects an arc discharge occurring in the control panel connected between the power system and the load. The control panel has a power supply circuit supplying a power supply voltage to the load and a connection part for connecting wiring. In addition, the arc discharge detection device as an example of the present disclosure includes an individual current detection unit detecting an increase in an individual current that flows in the power supply circuit and exceeds an individual current threshold, a voltage detection unit detecting an instant rise of a voltage of the power system, and an arc discharge detection unit identifying the arc discharge occurring in the control panel separately from a surge flowing into the power system based on a detection signal of the voltage of the power system from the voltage detection unit and a detection signal of the individual current from the individual current detection unit.

With this configuration, the arc discharge detection unit can identify an arc discharge occurring in the control panel based on the detection signal of the system voltage and the detection signal of the individual current, separately from a surge flowing into the power system, and thus it is possible to prevent a sudden change in the current caused by a surge from being falsely detected as an arc discharge.

In addition, in an example of the present disclosure, the system current detection unit includes a second current transformer detecting a current flowing from the power system to the control panel, a second wireless transmission unit wirelessly transmitting the detection signal of the system current with an electric power to be output to a secondary side of the second current transformer, and a second wireless reception unit receiving a transmission signal of the second wireless transmission unit.

With this configuration, since the arc discharge detection unit receives the detection signal of the current flowing from the power system to the control panel in wireless communication, the arc discharge detection unit can be disposed at a separate location from the control panel, and thus compatibility with existing facilities becomes high.

In addition, in an example of the present disclosure, the individual current detection unit includes a first current transformer detecting a current individually flowing in the power supply circuit, a first wireless transmission unit wirelessly transmitting the detection signal of the individual current with electric power to be output to a secondary side of the first current transformer, and a first wireless reception unit receiving a transmission signal of the first wireless transmission unit.

With this configuration, since the arc discharge detection unit receives the detection signal of the current individually flowing in the power supply circuit in wireless communication, the arc discharge detection unit can be disposed at a separate location from the control panel, and thus compatibility with existing facilities becomes high.

In addition, in an example of the present disclosure, a current change counting unit counting the number of operations of the individual current detection unit detecting the increase of the individual current exceeding the individual current threshold in a predetermined period of time as the number of changes, and an arc discharge occurring situation detection unit detecting an arc discharge occurring situation based on a detection result of the current change counting unit are further provided.

With this configuration, by detecting a sudden increase of the arc discharge occurrence frequency based on the counting result from the current change counting unit, an arc discharge occurring situation caused by, for example, a loosened terminal or the like can be detected, and the preservation of the control panel can be checked without relying on, for example, regular maintenance.

According to the present invention, it is possible to prevent a sudden change in a current caused by a surge from being falsely detected as an arc discharge and to detect the occurrence of an arc discharge in a control panel.

DESCRIPTION OF EMBODIMENTS

An embodiment for implementing the present invention will be described below with reference to several diagrams.

Application Example

Figure 1:
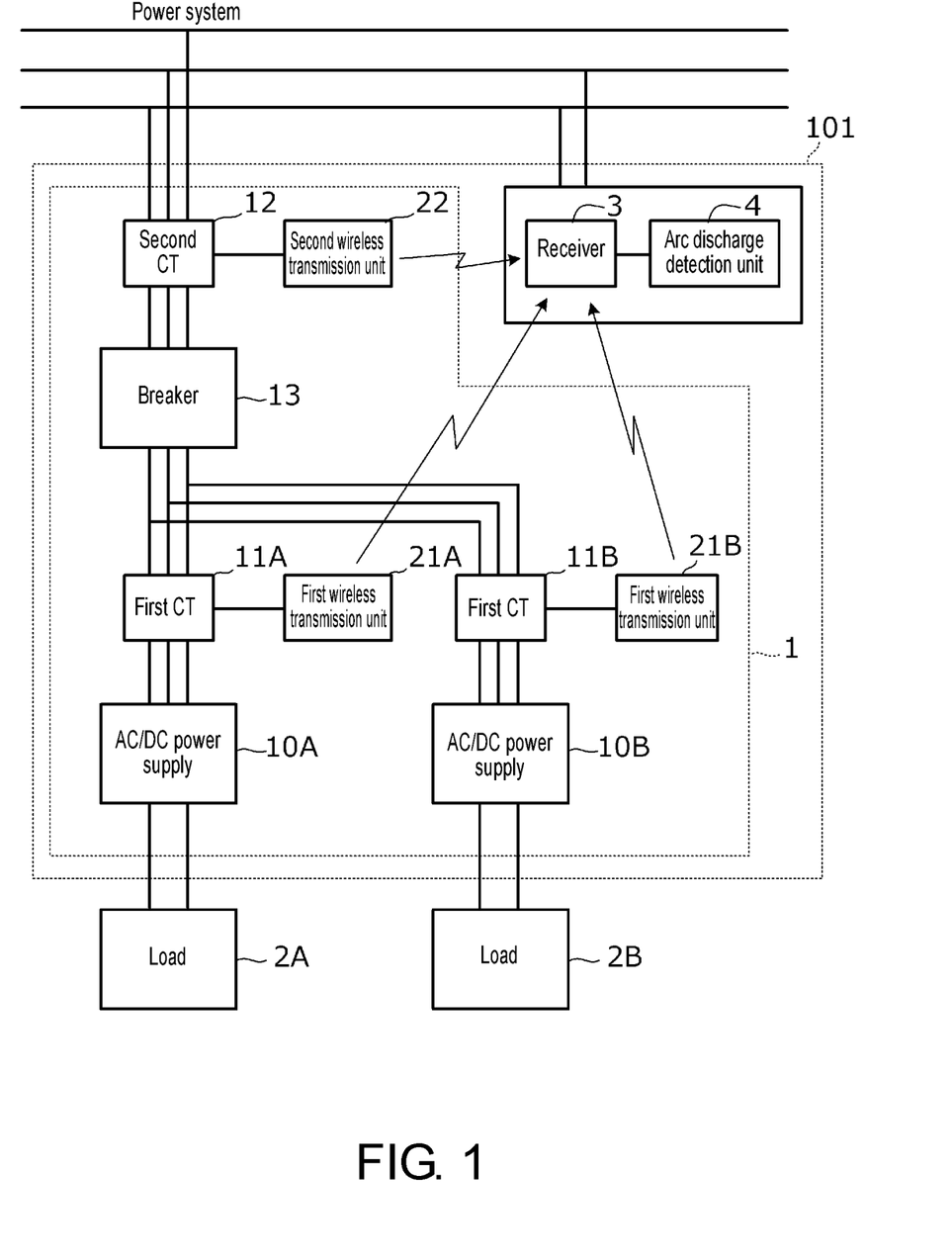
FIG. 1 is a diagram illustrating a configuration of an arc discharge detection device 101 according to an embodiment of the present invention.

First, an example to which the present invention is applied will be described with reference to FIG. 1. FIG. 1 is a diagram illustrating a configuration of an arc discharge detection device 101 according to an embodiment of the present invention.

The arc discharge detection device 101 according to the present embodiment is a device that detects an arc discharge occurring in a control panel 1 connected between the power system and loads 2A and 2B as illustrated in FIG. 1. The control panel 1 has a breaker 13 connected to the power system, AC/DC power supply circuits 10A and 10B that supply power supply voltage to the loads 2A and 2B, wiring connecting each of the units, and a connection part thereof. The arc discharge detection device 101 includes a system current detection unit that detects a system current flowing from the power system into the control panel 1, an individual current detection unit that detects an individual current flowing in the power supply circuits 10A and 10B, and an arc discharge detection unit 4. The arc discharge detection unit 4 identifies an arc discharge occurring in the control panel based on a detection signal of the system current and a detection signal of the individual current, separate from a surge flowing in the power system.

Configuration Example

Next, a configuration of an arc discharge detection device according to an embodiment of the present invention will be described with reference to drawings. FIG. 1 is a diagram illustrating a configuration of the arc discharge detection device 101 according to an embodiment of the present invention as described above.

The control panel 1 includes first current transformers 11A and 11B that detect currents flowing individually in the power supply circuits 10A and 10B, and a second current transformer 12 that detects a system current flowing from the power system into the control panel 1.

The first current transformer 11A detects a three-phase input current to the AC/DC power supply circuit 10A. Likewise, the other first current transformer 11B detects a three-phase current input to the AC/DC power supply circuit 10B. The second current transformer 12 detects a three-phase current input from the power system to the control panel 1. In FIG. 1, the current transformers 11A, 11B, and 12 are merely expressed as one block, and they are not zero-phase current transformers (ZCT).

Note that, although an example in which a three-phase AC voltage is taken from the three-phase power system is introduced in FIG. 1, the present invention can also be applied to a two-phase current and a single-phase current.

In addition, the control panel 1 includes first wireless transmission units 21A and 21B that wirelessly transmit detection signals of the first current transformers 11A and 11B and a second wireless transmission unit 22 that wirelessly transmits detection signals of the second current transformer 12.

The first wireless transmission unit 21A wirelessly transmits a detection signal of the first current transformer 11A with electric power to be output to a secondary side of the first current transformer 11A. Likewise, the first wireless transmission unit 21B wirelessly transmits a detection signal of the first current transformer 11B with electric power to be output to a secondary side of the first current transformer 11B. The second wireless transmission unit 22 wirelessly transmits a detection signal of the second current transformer 12 with electric power to be output to a secondary side of the second current transformer 12.

The arc discharge detection device 101 includes a receiver 3 that receives transmission signals of the first wireless transmission units 21A and 21B and the second wireless transmission unit 22, and an arc discharge detection unit 4 that detects an arc discharge based on the received signals of the receiver 3, separately from the control panel 1.

The first wireless transmission units 21A and 21B wirelessly transmit the detection signal when detection values of the first current transformers 11A and 11B rapidly increase to exceed a predetermined individual current threshold. In addition, the second wireless transmission units 22 wirelessly transmit the detection signal when a detection value of the second current transformer 12 rapidly increases to exceed a predetermined system current threshold.

The first current transformers 11A and 11B, the first wireless transmission units 21A and 21B, and the receiver 3 constitute an "individual current detection unit" according to the present invention. In addition, the second current transformer 12, the second wireless transmission unit 22, and the receiver 3 constitute a "system current detection unit" according to the present invention.

Further, although the first current transformers 11A and 11B are provided on the input side of the AC/DC power supply circuits 10A and 10B in FIG. 1, the transformers may be provided on the (output side) load side to detect a DC load current. With this configuration, a DC arc discharge can also be easily detected.

Figure 2:
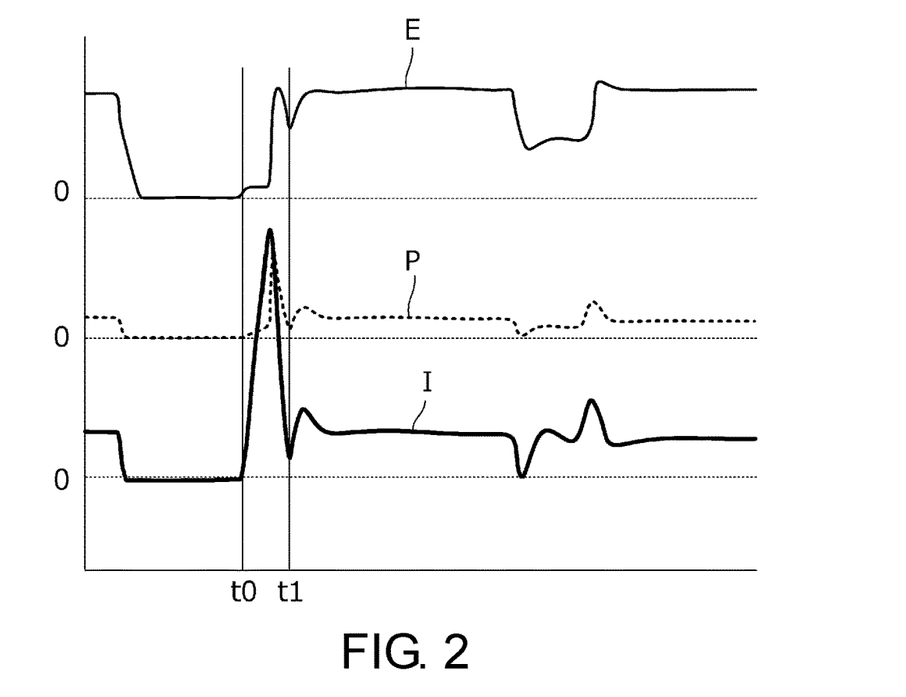
FIG. 2 is an example of a waveform diagram of a power supply circuit 10A.

FIG. 2 is an example of a waveform diagram of the power supply circuit 10A. In FIG. 2, a waveform E represents a waveform of a voltage applied to the power supply circuit 10A, a waveform I represents a waveform of a current flowing in the power supply circuit 10A, and a waveform P represents a waveform of electric power of the load 2A. In this example, an input voltage is applied to the power supply circuit 10A at a time t0, right after that, an arc discharge occurs at a connection part of the wiring connected to the power supply circuit 10A, and the arc discharge stops at a time t1.

If the connection part of the wiring connected to the power supply circuit 10A gets loose or the like, an arc discharge is likely to occur at the loose part immediately after a voltage is applied to the power supply circuit 10A. Also if a current starts flowing in the wiring at the time of the voltage input, for example, once a current path is opened due to the looseness of the connection part or the like, an arc discharge occurs at the part. The current waveform I significantly fluctuates due to this transient phenomenon.

Each of the waveforms at the above-described transient time similarly applies to the power source circuit 10B.

Figure 3:
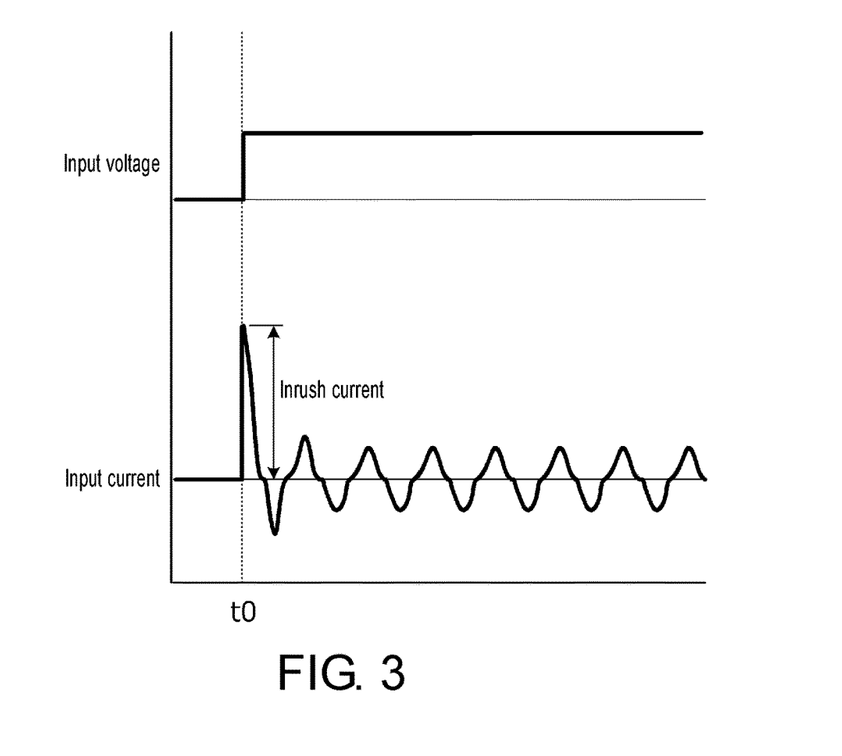
FIG. 3 is a typical waveform diagram of an input voltage and an input current with respect to a power supply circuit.

FIG. 3 is a typical waveform diagram of an input voltage and an input current with respect to the power supply circuits. An input voltage is applied to a power supply circuit at time t0, an inrush current flows therein at the time of the application, and in a static state thereafter, an input current fluctuates in accordance with a change in the load. The fluctuation is lower than the inrush current.

The inrush current at the time of the application of the input voltage flows even if no arc discharge occurs. However, the inrush current is low in comparison to that when an arc discharge occurs. Thus, a normal inrush current can be distinguished from a sudden current fluctuation caused by an arc discharge depending on whether a current value exceeds the predetermined individual current threshold. In a case where, for example, a normal inrush current is set to several ampere (A) and a peak current value caused by the occurrence of an arc discharge is set to dozens A, the individual current threshold is set to 10 A.

Since a surge flows in the power system, a system current input from the power system to the control panel is higher than the inrush current. Thus, the normal inrush current can be distinguished from the surge current depending on whether the current value exceeds the predetermined system current threshold. In a case where, for example, a normal inrush current is set to several A and a surge current is set to dozens A, the system current threshold is set to 10 A.

That is, the first wireless transmission units 21A and 21B wirelessly transmit the detection signal when detection values of the first current transformers 11A and 11B exceed the predetermined individual current threshold that is higher than the inrush current flowing in the power supply circuits 10A and 10B at the time of the application of the voltage. In addition, the detection signal is wirelessly transmitted when the detection value of the second current transformer 12 rapidly increases to exceed the system current threshold that is higher than the inrush current.

Note that the system current threshold and the individual current threshold may be the same value or different values.

Figure 4:
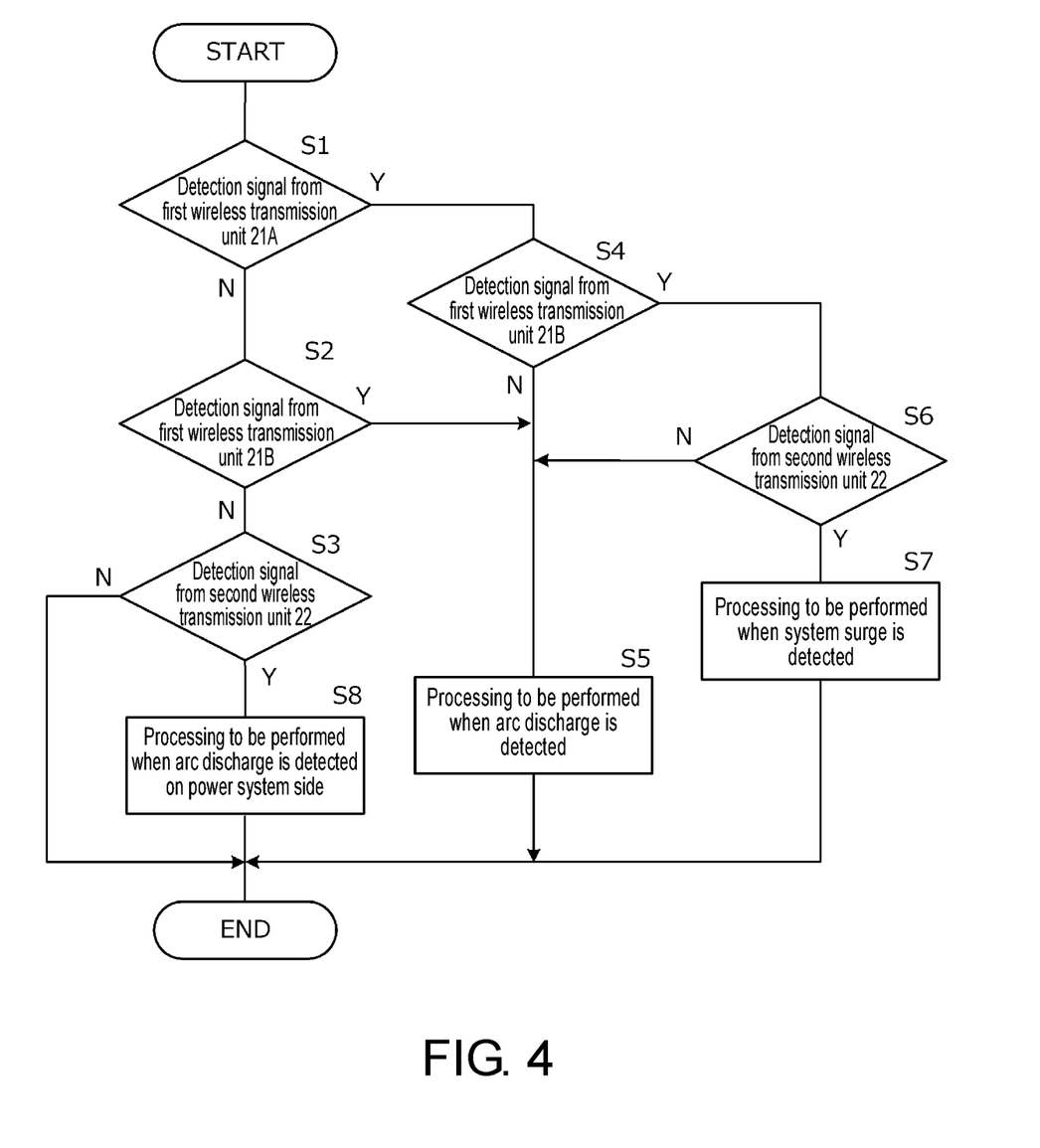
FIG. 4 is a flowchart showing details of processing of an arc discharge detection unit 4 illustrated in FIG. 1.

FIG. 4 is a flowchart showing details of processing of the arc discharge detection unit 4 illustrated in FIG. 1. As shown in the flowchart, if no detection signal is received from any of the first wireless transmission units 21A and 21B, and the second wireless transmission unit 22, no processing is performed here (S1→S2→S3→END). In other words, no processing is performed here if neither a system current nor an individual current rapidly increases. If a detection signal is received from either the first wireless transmission unit 21A or 21B, processing to be performed when an arc discharge is detected is performed (S1→S2→S5 or S1→S4→S5). The "processing to be performed when an arc discharge is detected" is processing accompanying detection of the occurrence of an arc discharge and, an alarm indication, for example, is output therein. In addition, the number of arc discharge detection operations is counted, as will be described below.

If a detection signal is received from all of the first wireless transmission units 21A and 21B and the second wireless transmission unit 22, processing performed when a system surge is detected is performed (S1→S4→S6→S7). As the "processing to be performed when a system surge is detected," for example, an indication indicating that a surge flows into the power system is displayed.

If a detection signal is received from the second wireless transmission unit 22 and no detection signal is received from any of the first wireless transmission units 21A and 21B, it is regarded that an arc discharge has occurred in the control panel 1 on the power system side, and processing in accordance with the situation is performed (S1→S2→S3→S8). That is, although, in a case of a system surge, a current input to the power system and the individual power supplies connected to the power system increases, in a case where an arc discharge occurs on the power system, it does not affect the individual power supplies. Using this difference, an arc discharge occurring on the power system side is detected.

As described above, whether a sudden increase in a current is from a surge caused in the power system or an arc discharge occurring in the control panel 1 is identified based on the detection signals from the first wireless transmission units 21A and 21B and the detection signal from the second wireless transmission unit 22.

Figure 5:
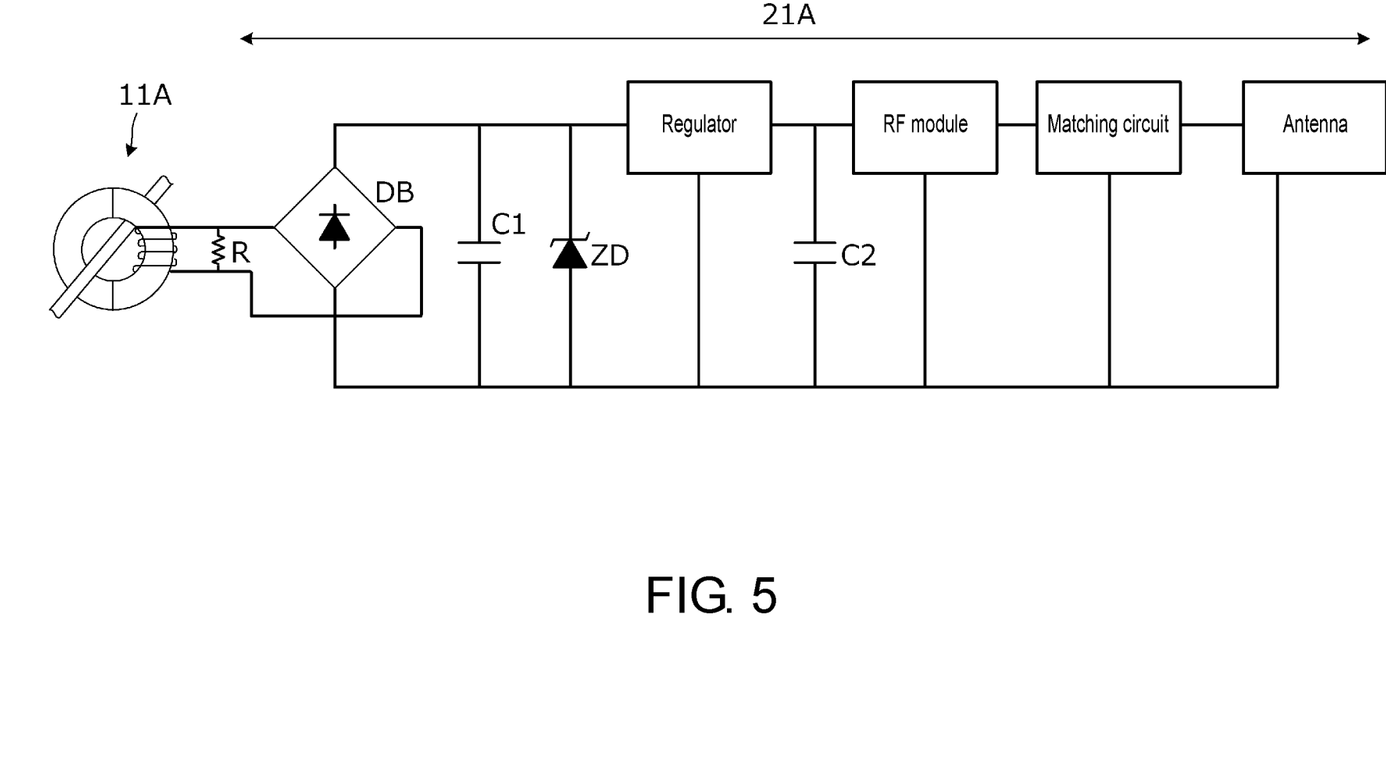
FIG. 5 is a diagram illustrating a configuration of a wireless transmission unit 21A illustrated in FIG. 1.

FIG. 5 is a diagram illustrating a configuration of the first wireless transmission unit 21A illustrated in FIG. 1. In the first wireless transmission unit 21A, a shunt resistor R is connected to the secondary-side output of the first current transformer 11A and a rectifier circuit with a diode bridge is connected thereto. A capacitor C1 for smoothing and storage and a Zener diode ZD for protection are connected to the output part of the rectifier circuit. A voltage that has been smoothed and stored in the capacitor C1 is stabilized in a regulator and stored in a capacitor C2. When the stored voltage exceeds a predetermined value, an RF module outputs a radio signal. A matching circuit that performs impedance matching is connected between the RF module and an antenna.

With this configuration, the detection signal of the first current transformer 11A can be wirelessly transmitted with electric power at the output on the secondary-side of the first current transformer 11A.

The configuration illustrated in FIG. 5 also applies to the first wireless transmission unit 21B and the second wireless transmission unit 22.

In the examples introduced so far, although an example in which a surge caused by the power system and an arc discharge in the control panel 1 are identified based on the detection signals from the first wireless transmission units 21A and 21B and the detection signal from the second wireless transmission unit 22 has been described, a voltage increase caused by a surge of the power system may be detected and a surge and an arc discharge may be identified using this detection as one piece of information, as will be described below.

Figure 6:
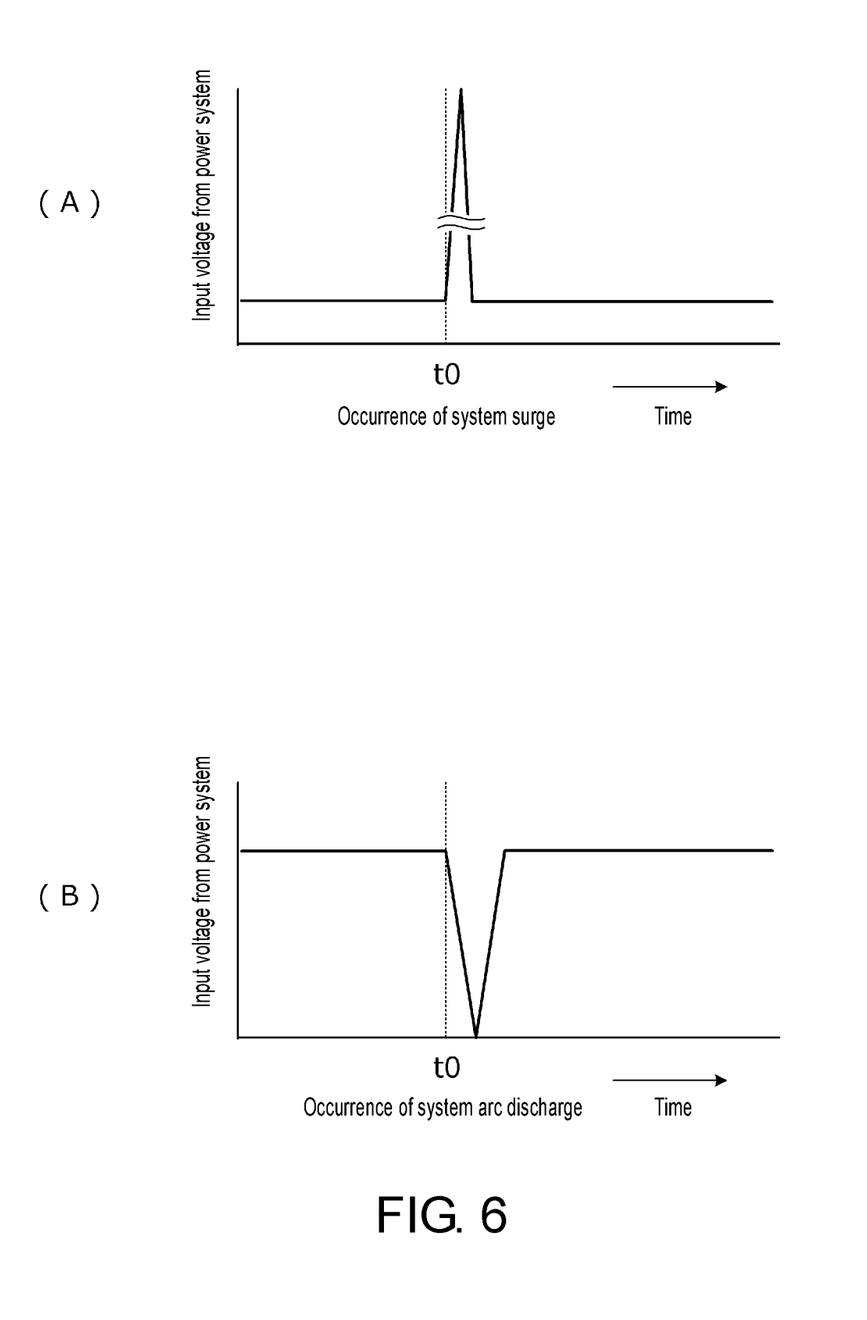
FIG. 6 including (A) and (B) are waveform diagrams of system voltages input from a power system to a control panel 1.

FIG. 6 including (A) and (B) are waveform diagrams of system voltages input from the power system to the control panel 1. In the example shown in (A) of FIG. 6, an induced lightning surge, for example, occurred in the power system at a time t0 and thus the system voltage increased at that moment. The arc discharge detection unit 4 illustrated in FIG. 1 detects the instant rise of the system voltage. In the example shown in (B) of FIG. 6, an arc discharge occurred in the power system at a time t0 and thus the input voltage from the power system decreased at that moment.

Figure 7:
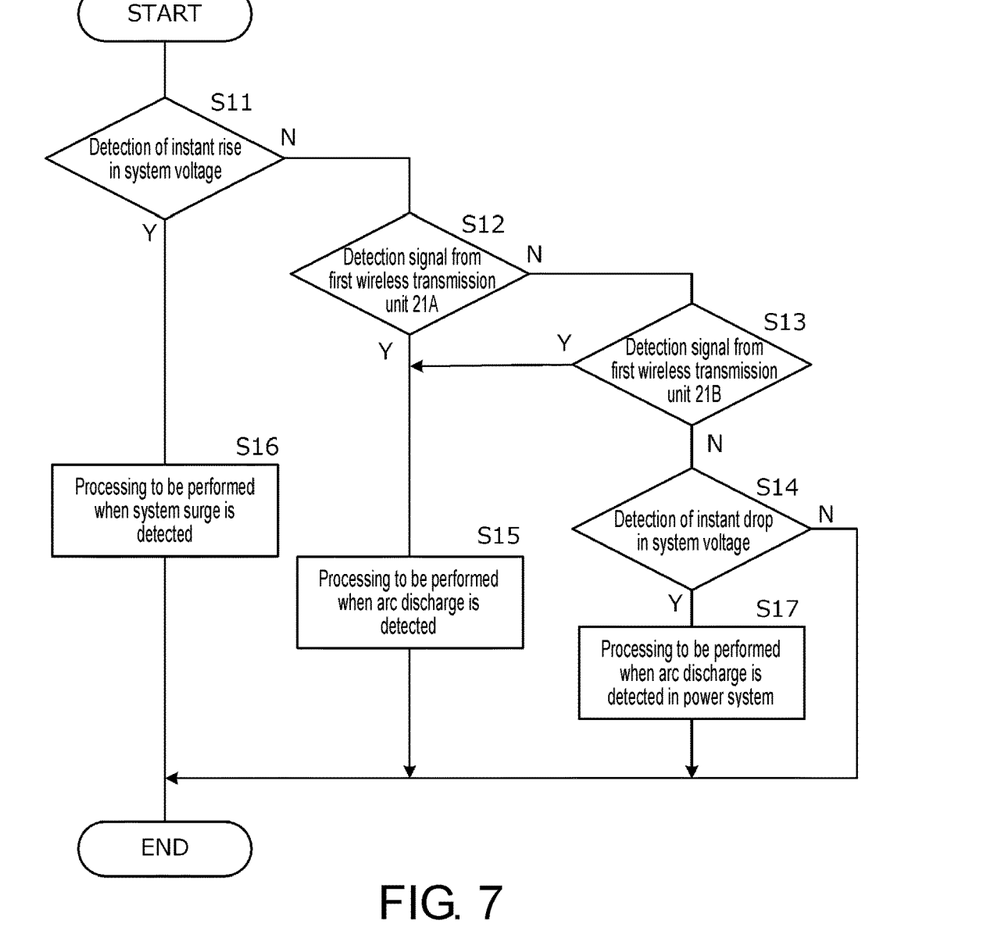
FIG. 7 is a flowchart showing details of another operation of processing of the arc discharge detection unit 4.

FIG. 7 is a flowchart showing details of processing of the arc discharge detection unit 4. As shown in the flowchart, if there is an instant rise in a system voltage, processing to be performed when a system surge is detected is performed (S11→S16). For example, an indication indicating that a surge has occurred in the power system is displayed.

If a detection signal is received from either of the first wireless transmission unit 21A and 21B, processing to be performed when an arc discharge is detected is performed (S14). For example, an alarm indication, or the like is output. In addition, the number of arc discharge detection operations is counted.

In addition, if there is an instant drop in the system voltage, it is regarded that an arc discharge has occurred in the power system, and processing corresponding thereto is performed (S14→S17).

If no detection signal is received from any of the first wireless transmission units 21A and 21B without an instant rise and an instant drop in the system voltage, no processing is performed here (S11→S12→S13→S14→END).

As described above, a voltage increase caused by a surge of the power system may be detected, and a surge and an arc discharge may be identified using this detection as one piece of information. In addition, a voltage decrease caused by an arc discharge in the power system may be detected, and accordingly, the occurrence of an arc discharge in the power system may be detected.

Although the above-described details of processing performed by the arc discharge detection unit 4 are an example of any processing performed at each time an arc discharge is detected, an occurrence situation of an arc discharge may be detected based on statistical information of detection signals received from the first wireless transmission units 21A and 21B in a given period as will be described below.

Figure 8:
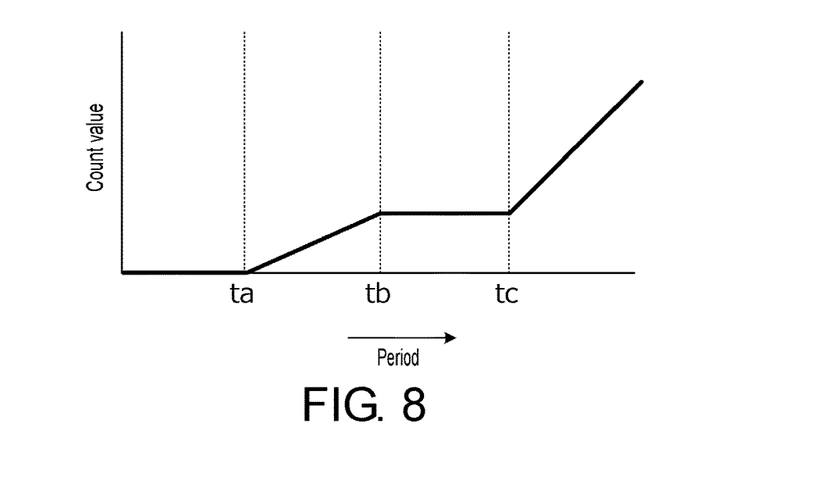
FIG. 8 is a graph showing an example of temporal change in the counted number of operations of receiving a detection signal from first wireless transmission units 21A and 21B illustrated in FIG. 1.

FIG. 8 is a graph showing an example of temporal change in the counted number of operations of receiving a detection signal from first wireless transmission units 21A and 21B illustrated in FIG. 1. In this example, the count value starts increasing at the time ta, and the increase of the count value stops at the time tb. Then, the count value suddenly increases at the time tc. If an increase in the count value has become higher than a predetermined reference values in a predetermined period of time, in other words, the reception frequency of the detection signals from the first wireless transmission units 21A and 21B is abnormally high, a connection part of wiring is regarded as having loosened, for example, and an alarm about the situation is output. Although a state of a low rate of increase in the count value in the predetermined period of time can be regarded as being attributable to a surge in the power system, in a case where the connection part of the wiring gets loosened, an arc discharge occurs highly frequently each time the power supply circuits 10A and 10B are activated. In addition, as carbonization of parts and dust resulting from arc discharge progresses, an arc discharge occurs more easily, and thus the rate of increase in the count value becomes higher.

The arc discharge detection unit 4 illustrated in FIG. 1 detects the rate of increase in the count value, and when the rate of increase exceeds a predetermined threshold, a situation in which an arc discharge has occurred is detected reliably. The arc discharge detection unit 4 of the present embodiment corresponds to an "arc discharge occurring situation detection unit" according to the present invention.

By detecting an arc discharge occurring situation as described above, the preservation of the control panel can be checked without relying on, for example, regular maintenance.

Finally, it is a matter of course that the description for implementing the above-described invention is merely exemplary and is not limitative. The invention can be appropriately modified and changed by a person skilled in the related art.

To detect a current, for example, a current sensor using a magnetic core, a Hall element, and an amplifier circuit may be used instead of a current transformer as long as the elements can supply a power supply voltage to the amplifier circuit. A current sensor using a Hall element can detect a DC current flowing between the power supply circuits 10A and 10B and the loads 2A and 2B.

What is claimed is:

1. An arc discharge detection device that is a device detecting an arc discharge occurring in a control panel connected between a power system and a load, the control panel having a power supply circuit supplying a power supply voltage to the load and a connection part for connecting wiring, the arc discharge detection device comprising:

a system current detection unit detecting an increase in a system current that flows from the power system into the control panel and exceeds a system current threshold;

an individual current detection unit detecting an increase in an individual current that flows in the power supply circuit and exceeds an individual current threshold; and an arc discharge detection unit identifying the arc discharge occurring in the control panel separately from a surge flowing into the power system based on a detection signal of the system current from the system current detection unit and a detection signal of the individual current from the individual current detection unit.

2. The arc discharge detection device according to claim 1, wherein the individual current detection unit includes:
a first current transformer detecting a current individually flowing in the power supply circuit,
a first wireless transmission unit wirelessly transmitting the detection signal of the individual current with electric power to be output to a secondary side of the first current transformer, and a first wireless reception unit receiving a transmission signal of the first wireless transmission unit.

3. The arc discharge detection device according to claim 1, wherein the system current detection unit includes:
a second current transformer detecting a current flowing from the power system to the control panel;
a second wireless transmission unit wirelessly transmitting the detection signal of the system current with an electric power to be output to a secondary side of the second current transformer, and
a second wireless reception unit receiving a transmission signal of the second wireless transmission unit.

4. The arc discharge detection device according to claim 2, further comprising:
a current change counting unit counting a number of operations of the individual current detection unit detecting the increase of the individual current exceeding the individual current threshold in a predetermined period of time as the number of changes; and
an arc discharge occurring situation detection unit detecting an arc discharge occurring situation based on a detection result of the current change counting unit.

5. The arc discharge detection device according to claim 1, further comprising:
a current change counting unit counting a number of operations of the individual current detection unit detecting the increase of the individual current exceeding the individual current threshold in a predetermined period of time as the number of changes; and
an arc discharge occurring situation detection unit detecting an arc discharge occurring situation based on a detection result of the current change counting unit.

6. The arc discharge detection device according to claim 3, further comprising:
a current change counting unit counting a number of operations of the individual current detection unit detecting the increase of the individual current exceeding the individual current threshold in a predetermined period of time as the number of changes; and
an arc discharge occurring situation detection unit detecting an arc discharge occurring situation based on a detection result of the current change counting unit.

7. The arc discharge detection device according to claim 3, wherein the individual current detection unit includes:
a first current transformer detecting a current individually flowing in the power supply circuit,
a first wireless transmission unit wirelessly transmitting the detection signal of the individual current with electric power to be output to a secondary side of the first current transformer, and
a first wireless reception unit receiving a transmission signal of the first wireless transmission unit.

8. The arc discharge detection device according to claim 7, further comprising:
a current change counting unit counting a number of operations of the individual current detection unit detecting the increase of the individual current exceeding the individual current threshold in a predetermined period of time as the number of changes; and
an arc discharge occurring situation detection unit detecting an arc discharge occurring situation based on a detection result of the current change counting unit.

9. An arc discharge detection device that is a device detecting an arc discharge occurring in a control panel connected between a power system and a load, the control panel having a power supply circuit supplying a power supply voltage to the load and a connection part for connecting wiring, the arc discharge detection device comprising:
an individual current detection unit detecting an increase in an individual current that flows in the power supply circuit and exceeds an individual current threshold;
a voltage detection unit detecting an instant rise of a voltage of the power system; and
an arc discharge detection unit identifying the arc discharge occurring in the control panel separately from a surge flowing into the power system based on a detection signal of the voltage of the power system from the voltage detection unit and a detection signal of the individual current from the individual current detection unit.

10. The arc discharge detection device according to claim 9, wherein the individual current detection unit includes:
a first current transformer detecting a current individually flowing in the power supply circuit,
a first wireless transmission unit wirelessly transmitting the detection signal of the individual current with electric power to be output to a secondary side of the first current transformer, and
a first wireless reception unit receiving a transmission signal of the first wireless transmission unit.

11. The arc discharge detection device according to claim 10, further comprising:
a current change counting unit counting a number of operations of the individual current detection unit detecting the increase of the individual current exceeding the individual current threshold in a predetermined period of time as the number of changes; and
an arc discharge occurring situation detection unit detecting an arc discharge occurring situation based on a detection result of the current change counting unit.

12. The arc discharge detection device according to claim 9, further comprising:
a current change counting unit counting a number of operations of the individual current detection unit detecting the increase of the individual current exceeding the individual current threshold in a predetermined period of time as the number of changes; and
an arc discharge occurring situation detection unit detecting an arc discharge occurring situation based on a detection result of the current change counting unit.

* * * * *